(12) United States Patent
Nishimura

(10) Patent No.: US 7,218,656 B2
(45) Date of Patent: May 15, 2007

(54) CONTROL OF SPECTRAL CONTENT OF A LASER DIODE LIGHT SOURCE

(75) Inventor: Ken A. Nishimura, Fremont, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 242 days.

(21) Appl. No.: 10/854,859

(22) Filed: May 26, 2004

(65) Prior Publication Data
US 2005/0276291 A1   Dec. 15, 2005

(51) Int. Cl.
H01S 3/00 (2006.01)
G01N 21/25 (2006.01)
G01N 21/85 (2006.01)
H05B 37/02 (2006.01)

(52) U.S. Cl. ............... 372/38.02; 356/405; 356/411; 315/307

(58) Field of Classification Search ............... 372/38.1, 372/38.02; 356/405, 411; 315/307
See application file for complete search history.

(56) References Cited

U.S. PATENT DOCUMENTS

| | | | |
|---|---|---|---|
| 6,122,042 A * | 9/2000 | Wunderman et al. | ......... 356/73 |
| 6,344,641 B1 | 2/2002 | Blalock et al. | |
| 6,394,626 B1 * | 5/2002 | McColloch | ................. 362/251 |
| 6,448,550 B1 | 9/2002 | Nishimura | |
| 6,507,159 B2 | 1/2003 | Muthu | |
| 6,630,801 B2 * | 10/2003 | Schuurmans | ................. 315/307 |
| 2003/0048539 A1 * | 3/2003 | Oostman et al. | ............. 359/634 |
| 2003/0230991 A1 * | 12/2003 | Muthu et al. | ................ 315/307 |
| 2005/0134197 A1 * | 6/2005 | Lee et al. | .................... 315/291 |

* cited by examiner

Primary Examiner—Minsun Oh Harvey
Assistant Examiner—Phillip Nguyen

(57) ABSTRACT

In one exemplary embodiment, apparatus is provided with a plurality of laser diodes, sensing means and control means. During normal operation, the laser diodes produce a mixed light. The sensing means measures light that is output by the laser diodes; and the control means 1) compares the measured light to a spectral reference, and 2) sets drive signals of the laser diodes in response to the comparison. In a related and exemplary method, 1) a mixed light is produced using a plurality of laser diodes of different colors, 2) a measurement of light produced by the laser diodes is compared to a spectral reference, and 3) drive signals of the laser diodes are automatically set in response to the comparison.

4 Claims, 2 Drawing Sheets

CONTROL OF SPECTRAL CONTENT OF A LASER DIODE LIGHT SOURCE

BACKGROUND

Light from a plurality of light emitting diodes (LEDs) of different colors (e.g., red, green and blue) has been used to create a light source of predetermined spectral balance (e.g., a "white" light source). See, for example, the U.S. Pat. No. 6,448,550 of Nishimura entitled "Method and Apparatus for Measuring Spectral Content of LED Light Source and Control Thereof".

SUMMARY OF THE INVENTION

One aspect of the invention is embodied in apparatus comprising a plurality of laser diodes, sensing means and control means. During normal operation, the laser diodes produce a mixed light. The sensing means measures light that is output by the laser diodes; and the control means 1) compares the measured light to a spectral reference, and 2) sets drive signals of the laser diodes in response to the comparison.

Another aspect of the invention is embodied in apparatus comprising a plurality of laser diodes of different colors, a number of photosensors, and control circuitry. The number of photosensors are positioned with respect to the laser diodes to measure light that is output by the laser diodes. The control circuitry is coupled to both the laser diodes and the number of photosensors. The control circuitry compares the measured light to a spectral reference, and then sets drive signals of the laser diodes in response to the comparison.

Yet another aspect of the invention is embodied in a method comprising 1) producing a mixed light using a plurality of laser diodes of different colors, 2) automatically comparing a measurement of light produced by the laser diodes to a spectral reference, and 3) automatically setting drive signals of the laser diodes in response to the comparison.

Other embodiments of the invention are also disclosed.

BRIEF DESCRIPTION OF THE DRAWINGS

Illustrative and presently preferred embodiments of the invention are illustrated in the drawings, in which.

DETAILED DESCRIPTION OF AN EMBODIMENT

The recent development of semiconductor laser diodes, capable of producing light of wavelengths spanning the range of 400–700 nanometers (nm), has enabled the use of laser diodes as a light source.

One difference between laser diodes and LEDs is the monochromatic nature of laser light. That is, the line widths of laser lights are typically narrower than 20 nm, and often less than 5 nm. Another difference between laser diodes and LEDs is that laser light is coherent, and can therefore be very bright. Brightness (or luminosity) takes into account the solid angle over which light is collected. As laser light has a low beam divergence, the etendue of the light is relatively small. One could create an equally intense light beam by using focusing optics, but the etendue of the beam would be large, as there would be a large divergence of the beam away from the focal point. Since the human eye has a relatively small etendue, coupling of a large etendue focused light beam into the eye is inefficient. Hence, for equal powers, the human eye perceives laser light as being much brighter than LED light. Therefore, the emergence of different colored laser diodes presents an opportunity for very bright illumination.

Similar to LEDs, laser diodes can produce a fairly wide range of light in response to a given input current. For example, lasers are very sensitive to temperature, and even with a stable drive current, their output power (and photon flux) can vary significantly with temperature. The wavelength peak of a laser diode is also temperature dependent. Laser diodes operated at high powers also tend to age, and their efficiency will drop over time. A light source comprised of laser diodes of different colors will therefore have a varying spectral content as a function of temperature, age and other factors.

Often, it is desirable that a light source maintain a certain spectral content. To this end, FIGS. 1 & 2 illustrate exemplary apparatus 100 for doing this.

Figure 1:
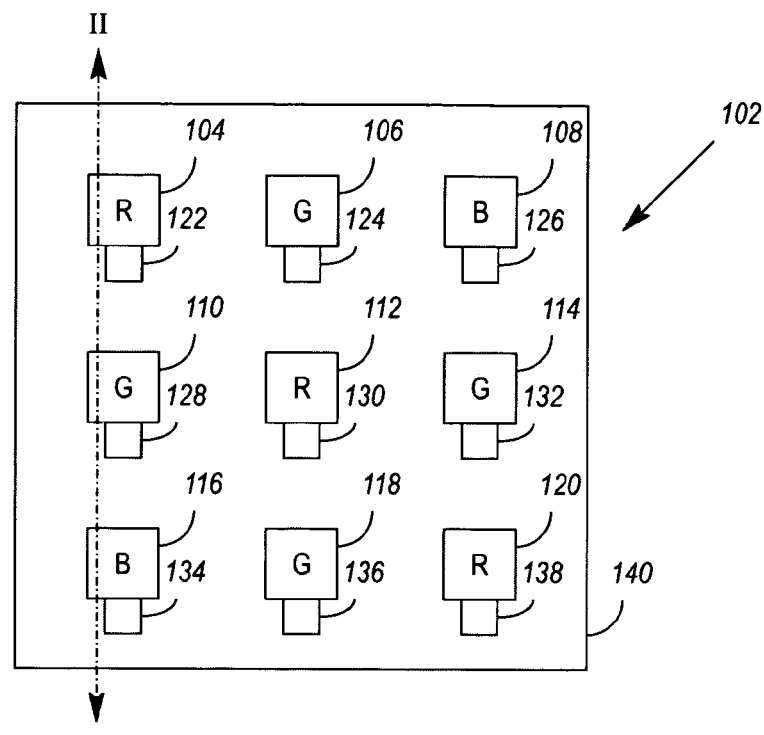
FIG. 1 illustrates a front view of the laser diodes and sensing means in an exemplary apparatus for maintaining spectral content of a laser diode light source.
Figure 2:
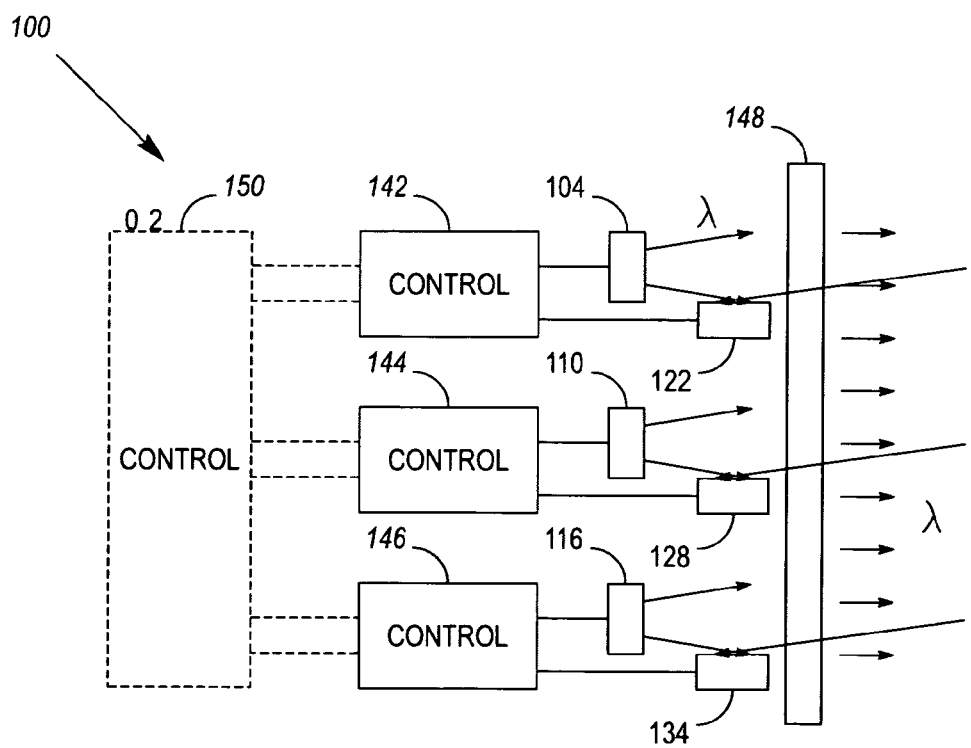
FIG. 2 illustrates a side view of the laser diodes and sensing means shown in FIG. 1, along with a control means for controlling the laser diodes in response to light measured by the sensing means.

As shown in FIGS. 1 & 2, a light source 102 may comprise a plurality of laser diodes 104, 106, 108, 110, 112, 114, 116, 118, 120 of different colors (e.g., red (R), green (G) and blue (B) laser diodes). During normal operation, the laser diodes 104–120 produce a mixed light.

A sensing means 122, 124, 126, 128, 130, 132, 134, 136, 138 measures light that is output by the laser diodes 104–120. By way of example, the sensing means may comprise a plurality of photosensors 122–138, such as photodiodes. In one embodiment, at least some of the photosensors 122–138 are positioned with respect to the laser diodes 104–120 so as to sense the light that is output by one or more laser diodes of like color. That is, the photosensors are configured to measure light from diodes of a predetermined wavelength. In another embodiment, at least some of the photosensors 122–138 are associated with filter elements, with each filter element restricting the spectral response of its corresponding photosensor.

In FIG. 1, a plurality of laser diodes 104–120 and photosensors 122–138 are shown to be mounted on a common substrate 140. However, they need not be. In one embodiment, the substrate 140 is used to provide interconnections between the laser diodes 104–120, sensing means 122–138, and a control means 142, 144, 146. In mounting devices on the substrate 140, the substrate 140 may be used to provide a common terminal (anode or cathode) for the devices mounted thereon. It may be advantageous to use the substrate 140 as a common terminal in that it reduces the number of necessary connections between the devices. However, in some circumstances, it may be advantageous to separate the connections between the laser diodes 104–120 and photosensors 122–138, so that the relatively large currents flowing through the laser diodes 104–120 do not interfere with the ability to measure the relatively small currents provided by the photosensors 122–138.

The number and arrangement of laser diodes 104–120 and photosensors 122–138 shown in FIGS. 1 & 2 is merely exemplary, and the number of laser diodes and photosensors in an actual light source may be determined to a great extent by the actual light output of the laser diodes 104–120, and the light output needed for a given application.

The apparatus 100 shown in FIGS. 1 & 2 further comprises a control means 142–146 for 1) comparing the light measured by the sensing means 122–138 to a spectral reference, and 2) setting drive signals of the laser diodes 104–120 in response to the comparison. The control means 142–146 may comprise control circuitry that is coupled to both the laser diodes 104–120 and the sensing means 122–138. In one embodiment, the control means 142–146 may further communicate with firmware or software to, for example, receive a programmed setting for its spectral reference.

As with LEDs, the average photon flux from a laser diode can be modified by changing its drive current or duty cycle. However, given that laser diodes are most efficient over a relatively narrow range of operating currents, it may be useful to pulse width modulate the drive currents of laser diodes. That is, the drive signals of the laser diodes 104–120 may be set, at least in part, by pulse width modulating the drive signals. To mitigate "flicker", the drive signals of some or all of the laser diodes 104–120 need not be pulse width modulated to a depth of "zero", but may rather be pulse width modulated between first and second non-zero values.

If the laser diodes 104–120 are positioned to project light through an illumination target 148 (e.g., if the laser diodes 104–120 serve as a backlight for a display screen), the sensing means 122–138 may be positioned to measure a combination of light generated by the laser diodes 104–120, and light transmitted through the illumination target 148. Alternately, or additionally, the sensing means 122–138 may be positioned to measure a combination of light generated by the laser diodes 104–120, and light reflected from the illumination target 148. In this manner, the apparatus 100 could respond to spectral changes brought about by non-uniform albedo of the target 148, or mixing of ambient light with the light generated by the laser diodes 104–120.

Although the sensing means 122–138 may be distinct from the laser diodes 104–120, it is noted that most laser diodes 104–120 are assembled with a dedicated monitor photodiode. Such a photodiode is typically coupled to overdrive protection means (part of controls 142–146, FIG. 2) which, in response to a signal received from the photodiode, limits the photon flux of a corresponding laser diode to insure that the laser diode does not self-destruct as a result of overdrive. In one embodiment of the apparatus 100, the sensing means 122–138 is implemented using these monitor photodiodes. That is, in addition to providing a monitor photodiode's output to an overdrive protection means, the photodiode's output could also be provided to control means 142. The laser diodes 104–120 and photosensors (e.g., monitor photodiodes) would therefore have a one-to-one correspondence.

In one embodiment, the overdrive protection means and control means 142 operate in parallel, but independently, with each having an effect on a laser diode's drive signal. In another embodiment, a portion 150 of the control means receives feedback from the overdrive protection means 142–146 and, upon trigger of overdrive protection for a given laser diode, the control means 150 modifies the setpoints of other laser diodes to maintain spectral content of the overdrive protected and other laser diodes as a whole.

Exemplary embodiments of the sensing means 122–138 and control means 142–146 will now be described. To begin, a spectral reference is statically or dynamically provided to the control means 142–146. By way of example, the spectral reference may be set in terms of an equivalent color temperature.

In one embodiment, the control means comprises individual circuits 142–146, each of which is associated with a particular laser diode. Each circuit 142–146 may comprise an integrator that is coupled to receive a signal (e.g., a current) from a photosensor. For example, an integrator 314 of control circuit 146 may receive feedback from photosensor 134. The integrator 314 converts photodiode current into a voltage representing the amount of light in that part of the spectrum. The voltage output of each integrator is fed to a window comparator. The purpose of the window comparator is to compare the input signal to a spectral reference, and assert an output when the input signal differs from the reference by more than a specified amount of hysteresis. The spectral reference may be provided by means of a digital-to-analog converter (DAC, not shown). The gated outputs of the window comparator are then fed to an up/down counter which drives a digital-to-analog converter. The digital-to-analog converter, in turn, sets a drive signal for the laser diode 116.

Turning to the circuit 146 in more detail, one sees that photodiode 134 feeds operational amplifier (op amp) 300, which uses a capacitor 302 to form an integrator 314. The output of the integrator 314, a voltage representing the amount of photon flux ($\lambda$) incident on photodiode 134, feeds the comparators 304, 306 of a window comparator. The output of comparator 304 will be high if the output of the integrator 300, 302 is below a spectral reference voltage VR (e.g., a desired spectral content for a red laser diode). Similarly, the output of comparator 306 will be high if the output of the integrator 300, 302 is higher than the spectral reference voltage VR+$\Delta$R. Reference levels VR and VR+$\Delta$R are provided by an additional digital-to-analog converter (not shown). The outputs of the comparators 304 and 306 feed an up/down counter 308. The output of the counter 308 feeds digital-to-analog converter (DAC) 310 which, in turn, feeds driver 312 to control the intensity of laser diode 116. While a field effect transistor (FET) is shown for driver 290, bipolar transistors may also be used.

When the desired photon flux is below the desired level set by reference VR, the output of comparator 304 will be high. Counter 308 then counts up, thereby increasing the value feeding DAC 310, increasing the voltage on the gate of driver 312, and increasing the brightness of laser diode 116.

Similarly, if the desired photon flux is above the desired level set by reference VR+$\Delta$R, the output of comparator 306 is high, thereby causing counter 308 to count down. This decreases the value sent to DAC 310, decreases the voltage on the gate of driver 290, and decreases the brightness of laser diode 116.

The difference between reference voltages VR and VR+$\Delta$R provides hysteresis in the operation of laser diode 116. Thus, its output will not be adjusted if it is within the window set by these two reference levels.

By performing intensity measurements and adjustments over several measure/integrate/compare/set drive signal cycles, changes are made in a gradual manner.

Note that state information is held in counter 308. For more efficient startup, control circuitry could preserve the value of this counter across power cycles, restoring the counter to its last operating values as a good first approximation of a starting level.

Figure 3:
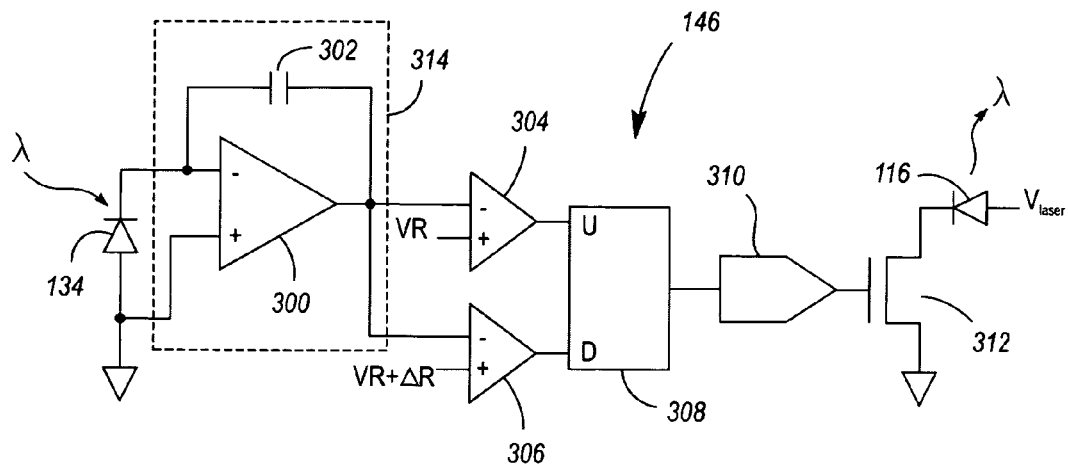
FIG. 3 illustrates an exemplary block diagram of the FIG. 2 control means.

The embodiment of control 146 shown in FIG. 3 uses linear control to vary the intensity of a laser diode 116. The digital-to-analog converter (DAC) 310 generates an analog level to feed driver 312, thereby controlling the intensity of laser diode 116. Essentially, driver 312 is used as a variable resistor. This type of arrangement can be inefficient, as the voltage dropped across driver 312 is turned into heat. More efficient control may be obtained by using a switching converter to drive a laser diode 116.

Switching converters are well known in the art, and are manufactured by companies such as Texas Instruments and Maxim Integrated Circuits. As is known in the art, in a switching converter, varying pulse width or duty cycle is used to control a switch, producing an adjustable output voltage with very high efficiency. Laser diodes exhibit relatively high series resistance, so stable control of current is attainable by adjusting the voltage applied to the laser diode.

The embodiment of FIG. 3 is adapted to use switching converters by using the outputs of the comparators 304, 306 to control the pulse widths for a switching converter driving a laser diode 116. When a desired level is too low, the corresponding pulse width is increased, increasing the "on" time of the switching converter, increasing its output voltage, and increasing the corresponding laser diode current and luminous output. The value of counter 308 may be used to determine the pulse width for the switching converter.

Figure 4:
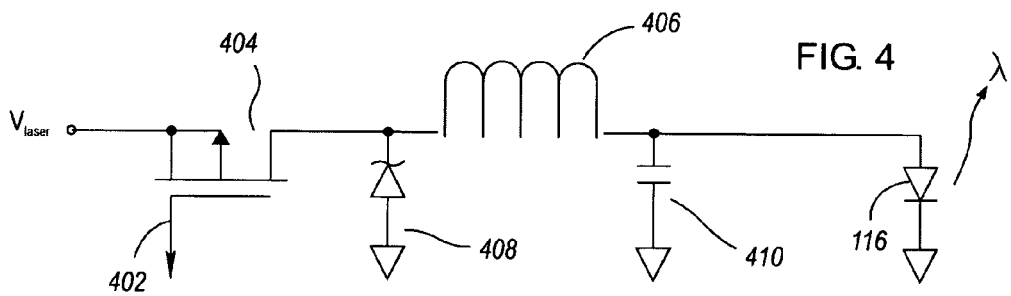
FIG. 4 illustrates an exemplary switching converter that may be used by the control means of FIG. 3.

FIG. 4 illustrates a step-down switching converter for use when the laser diode supply voltage ($V_{laser}$) is higher than the voltage applied to the laser diode 116. Other topologies of switching converter may also boost a laser diode voltage (if needed). Pulse width modulated drive signal 402 drives the gate of MOS switch 404. When switch 404 is turned on, voltage is applied across inductor 406, causing current to flow through the inductor. When switch 404 is turned off, current continues to flow in inductor 406, with the circuit completed by catch diode 408, preferably a Schottky diode. The voltage across laser diode 116 is smoothed by capacitor 410. The voltage across laser diode 116 is proportional to the "on" time of switch 404, and therefore the pulse width of drive signal 402.

Figure 5:
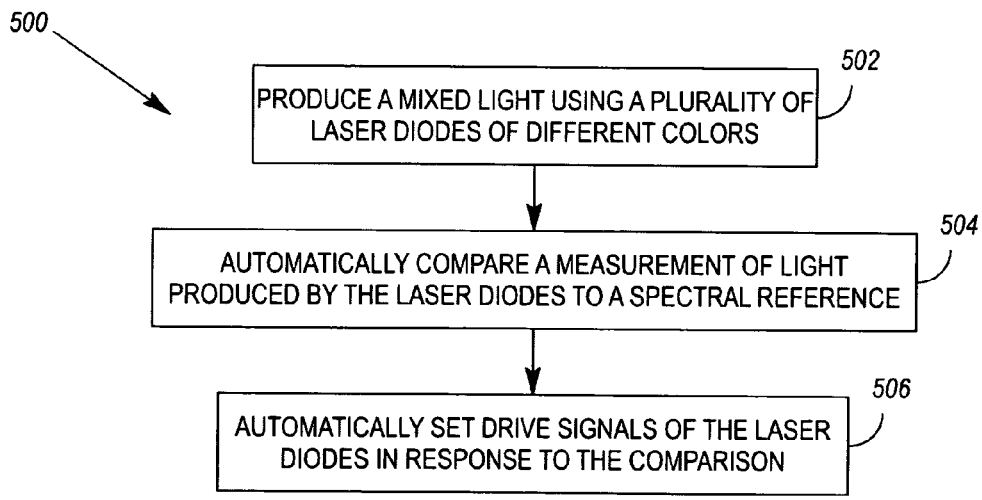
FIG. 5 illustrates an exemplary method for maintaining spectral content of a laser diode light source.

FIG. 5 illustrates a method 500 that may be implemented by apparatus 100 such as that which is illustrated in FIG. 1, as well as other apparatus. The method 500 comprises 1) producing 502 a mixed light using a plurality of laser diodes of different colors, 2) automatically comparing 504 a measurement of light produced by the laser diodes to a spectral reference; and 3) automatically setting 506 drive signals of the laser diodes in response to the comparison.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. An apparatus, comprising:
a plurality of laser diodes of different colors producing a mixed light with a predetermined spectral content;
a number of photosensors positioned with respect to the laser diodes to measure light that is output by the laser diodes, and
control circuitry, coupled to the laser diodes and the number of photosensors to compare said measured light to a spectral reference and set drive signals of the laser diodes in response to the comparison so as to maintain the predetermined spectral content of the mixed light;
wherein at least some of the photosensors are monitor photodiodes, assembled with individual ones of the laser diodes, the apparatus further comprising overdrive protection circuitry to receive signals from said monitor photodiodes and, in response thereto, limit photon fluxes of corresponding laser diodes.

2. The apparatus of claim 1, wherein the control circuitry receives feedback from said overdrive protection circuitry and, upon triggering of overdrive protection for a given laser diode, the control circuitry modifies the setpoints of other laser diodes to maintain spectral content of the overdrive-protected laser diodes and other laser diodes as a whole.

3. An apparatus, comprising:
a plurality of laser diodes that during normal operation produce a mixed light with a predetermined spectral content;
sensing means for measuring light output by the laser diodes, and
control means for (i) comparing the measured light to a spectral reference, and (ii) setting drive signals of the laser diodes in response to the comparison so as to maintain the predetermined spectral content of the mixed light; wherein the sensing means comprises monitor photodiodes, assembled with individual ones of the laser diodes, the apparatus further comprising overdrive protection means for receiving signals from said monitor photodiodes and, in response thereto, limiting photon fluxes of corresponding laser diodes.

4. The apparatus of claim 3, wherein the control means receives feedback from the overdrive protection means and, upon triggering of overdrive protection for a given laser diode, the control means modifies the setpoints of other laser diodes to maintain spectral content of the overdrive-protected laser diodes and other laser diodes as a whole.

* * * * *